(12) United States Patent
Kumamoto et al.

(10) Patent No.: US 6,632,704 B2
(45) Date of Patent: Oct. 14, 2003

(54) MOLDED FLIP CHIP PACKAGE

(75) Inventors: Takashi Kumamoto, Ibaraki-ken (JP); Kinya Ichikawa, Ibaraki-ken (JP)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/741,535

(22) Filed: Dec. 19, 2000

(65) Prior Publication Data

US 2002/0109241 A1 Aug. 15, 2002

(51) Int. Cl.⁷ .............................................. H01L 21/44
(52) U.S. Cl. ........................ 438/106; 438/108; 438/125; 438/126; 438/127
(58) Field of Search ................................. 438/125–127, 438/106, 108, 612–613

(56) References Cited

U.S. PATENT DOCUMENTS

| | | | |
|---|---|---|---|
| 5,450,283 A | * 9/1995 | Lin et al. ..................... 361/704 |
| 5,784,261 A | 7/1998 | Pedder |
| 5,895,229 A | * 4/1999 | Carney et al. ............... 438/106 |
| 5,981,314 A | * 11/1999 | Glenn et al. ................. 438/127 |
| 5,998,243 A | 12/1999 | Odashima et al. |
| 6,038,136 A | * 3/2000 | Weber ......................... 174/260 |
| 6,048,483 A | * 4/2000 | Miyajima .................. 264/272.14 |
| 6,049,122 A | 4/2000 | Yoneda |
| 6,071,755 A | * 6/2000 | Baba et al. .................. 438/106 |
| 6,081,997 A | * 7/2000 | Chia et al. ..................... 29/841 |
| 6,187,243 B1 | * 2/2001 | Miyajima .............. 264/272.15 |
| 6,344,162 B1 | 2/2002 | Miyajima |

FOREIGN PATENT DOCUMENTS

| | | |
|---|---|---|
| EP | 0971401 A2 | 1/2000 |
| GB | 2297652 A | 7/1996 |
| JP | 59-208756 | 11/1984 |
| JP | 11-195742 | 7/1999 |
| JP | P2000-150760 A | 5/2000 |

OTHER PUBLICATIONS

PCT Search Report, PCT/US02/117882, Oct. 22, 2002.

* cited by examiner

*Primary Examiner*—David L. Talbott
*Assistant Examiner*—Luan Thai
(74) *Attorney, Agent, or Firm*—Blakely, Sokoloff, Taylor & Zafman LLP

(57) ABSTRACT

A method for producing a molded flip chip package is described. The incomplete flip chip package comprising a thin substrate and a silicon chip is placed in a mold. A resin, preferably epoxy, is injected into the mold filling the gap between the surface of the flip chip and the adjacent substrate. Additionally, a stiffening structure is formed to increase the overall rigidity of the thin substrate specifically and the package as a whole.

2 Claims, 4 Drawing Sheets

MOLDED FLIP CHIP PACKAGE

COPYRIGHT NOTICE

Contained herein is material that is subject to copyright protection. The copyright owner has no objection to the facsimile reproduction of the patent disclosure by any person as it appears in the Patent and Trademark Office patent files or records, but otherwise reserves all rights to the copyright whatsoever.

BACKGROUND OF THE INVENTION

1. Field of the Invention

The invention relates generally to the field of integrated circuit packaging. More particularly, the invention relates to an epoxy package that is formed in a single molding operation.

2. Description of the Related Art

Traditionally, semiconductor chips have been electrically coupled to electrical traces on a substrate via wire interconnects that are soldered on one end to the top active area of the chip and soldered to trace pads on the substrate that surround the chip on the other end. These types of interconnects are not particularly efficient, requiring space for both the surface area of the chip and a perimeter region for the trace pads, resulting in larger chip packages. To more efficiently utilize the substrate surface and facilitate smaller chip packages, the flip chip interconnection process was developed. Essentially, the active surface of the semiconductor chip is flipped over to face the substrate and the chip is soldered directly to trace pads located adjacent to the active surface. The result is a more compact and space-efficient package.

One of the most successful and effective methods of electrically connecting a flipped chip utilizes controlled-collapse chip connection technology (C4). First, solder bumps are applied to pads on the active side of the chip, the substrate or both. Next, the solder bumps are melted and permitted to flow, ensuring that the bumps are fully wetted to the corresponding pads on the chip or substrate. A tacky flux is typically applied to one or both of the surfaces to be joined. The flux-bearing surfaces of the chip and substrate are then placed in contact with each other in general alignment. A reflow is performed by heating the chip and substrate package to or above the solder's melting point. The solder on the chip and the substrate combine and the surface tension of the molten solder causes the corresponding pads to self-align with each other. The joined package is then cooled to solidify the solder. The resulting height of the solder interconnects is determined based on a balance between the surface tension of the molten solder columns and the weight of the chip. Any flux or flux residue is removed from the chip and substrate combination in a defluxing operation. Finally, an epoxy underfill is applied between the bottom surface of the chip and the top surface of the substrate, surrounding and supporting the solder columns. The reliability and fatigue resistance of the chip substrate solder connection is increased significantly. The underfill acts to carry a significant portion of the thermal loads induced by coefficient of thermal expansion (CTE) differences between the chip and substrate, rather than having all the thermal load transferred through the solder columns.

It is desirable in many integrated circuit applications to utilize as thin a substrate or film as possible to maximize the electrical performance of the resulting packaged chip. Typically, thin substrates or films are comprised of a polymeric material and are 0.05 to 0.5 mm thick. A thin substrate's shorter vias help reduce loop inductance within the substrate. Unfortunately, these thin substrates are very flexible making it difficult to attach solder balls or pins thereto. Furthermore, in unreinforced form they are susceptible to damage during installation and removal operations. The current practice is to bond rigid blocks of a suitable material to the periphery of the substrate to stiffen the entire package. The additional operation of bonding the rigid blocks to the thin substrate significantly increases the cost of the thin substrate package compared to a comparable package with a thicker substrate.

A typical prior art chip package utilizing a thin substrate is illustrated in FIG. 1. A silicon chip 110 is electrically coupled and joined to a thin substrate 120 by reflowed solder bumps 130. The chip package may also include various passive components 140, such as resistors and capacitors, also electrically coupled to the substrate 120. An epoxy underfill 160 supplements the solder bump joint 130 between the chip 110 and the thin substrate 120. A solder 145 may also be present around each of the passive components. Finally, stiffening blocks 150 comprising a suitable polymeric or ceramic or metal material are attached to the general periphery of the thin substrate 120 with an adhesive 155 to increase the overall rigidity of the package. Although not shown, the thin substrate may have attached to its backside a ball grid array (BGA) or pin grid array (PGA) to facilitate attachment of the chip package with a circuit board.

BRIEF DESCRIPTION OF THE SEVERAL VIEWS OF THE DRAWINGS

The present invention is illustrated by way of example, and not by way of limitation, in the figures of the accompanying drawings and in which like reference numerals refer to similar elements and in which.

DETAILED DESCRIPTION OF THE INVENTION

A molded chip package and a method for fabricating the molded chip package are described. In described embodiments of the invention, a single molding process is utilized to both underfill the silicon chip and provide structure to increase the rigidity of a chip package. Advantageously, the number of operations to fabricate a chip package utilizing a thin substrate is decreased.

Figure 1:
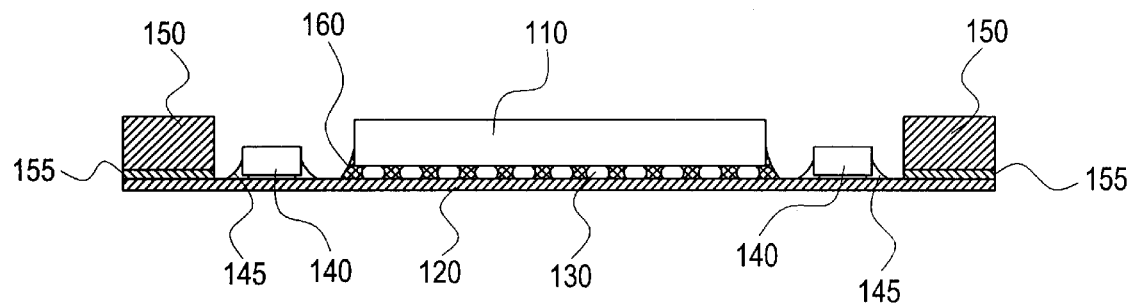
FIG. 1 is an illustration of a prior art package wherein a thin substrate is utilized.
Figure 2A:
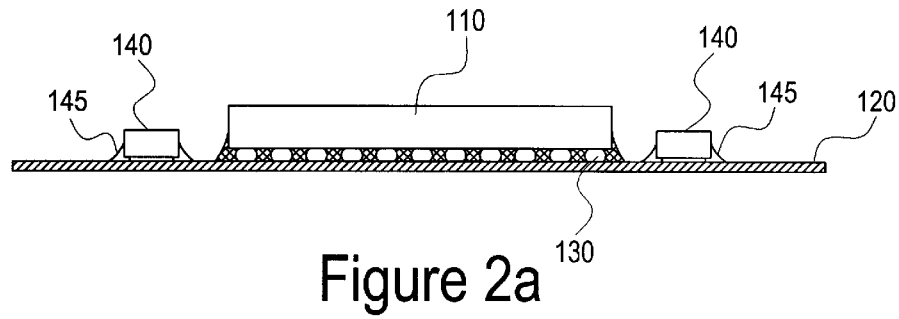
FIGS. 2a–f are illustrations of a chip package after various operations have been performed including the finished chip package as shown in FIG. 2f according to one embodiment of the invention.
Figure 2B:
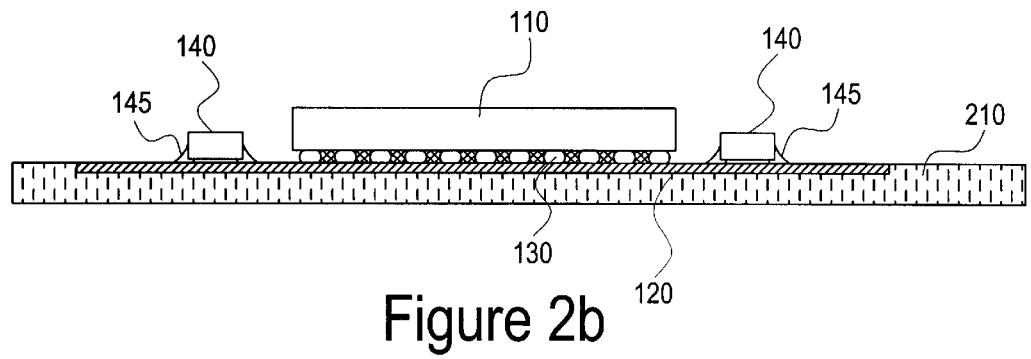

FIGS. 2a–2f illustrate a chip package after various operations according to a preferred embodiment of the invention have been performed. FIG. 3 is a flow chart listing the various operations that are performed in molding the chip package. In block 310, an incomplete chip package in which a chip and a substrate have been joined using a flip chip process, such as illustrated in FIG. 2a, is placed in a bottom mold half 210. The mold comprising both the bottom half 210 and the top half 220 may be comprised of any suitable material including various metals, plastics, ceramics and composites. Preferably, the mold will have sufficient rigidity to retain its form while an encapsulating resin is injected into the mold under pressure. The bottom mold half 210 may be coated with a release agent or it may be covered in part with a release film. FIG. 2b illustrates a chip/substrate package placed in the bottom mold half 210.

Figure 2C:
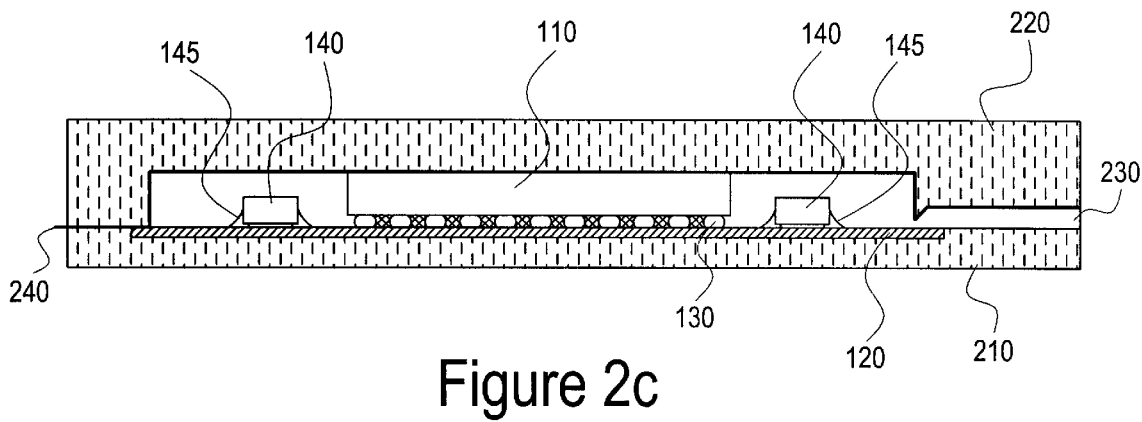
Figure 3:
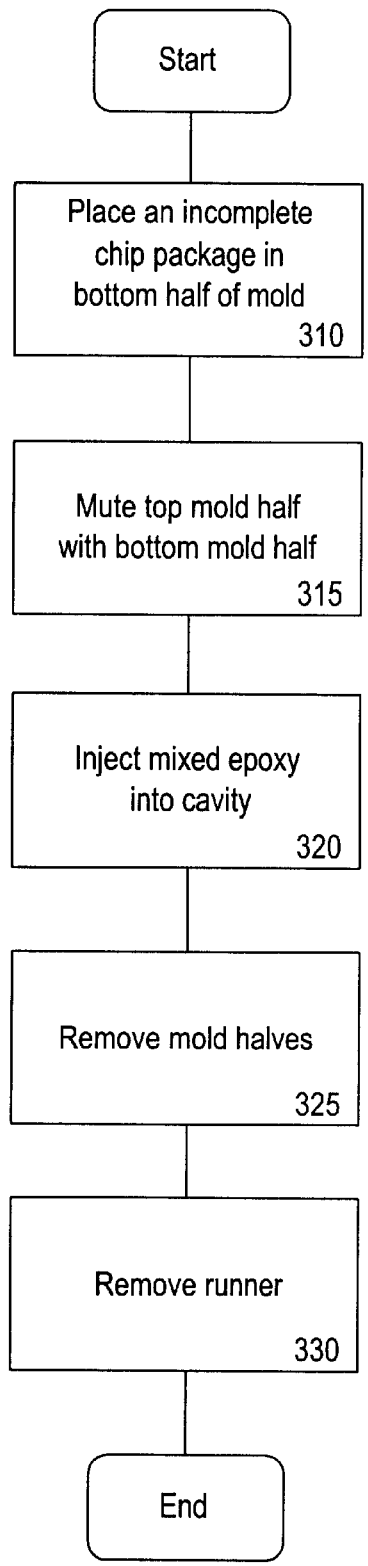
FIG. 3 is a flow chart describing a method of fabricating a chip package according to one embodiment of the present invention.

In block 315, the top mold half 220 is placed over the chip/substrate package as shown in FIG. 2c. A runner 230 is formed at the intersection of both mold halves through which a resin may be injected. Very small air vents are also present in the mold, generally opposite the runner so that the displaced air within the mold can escape when displaced by injected resin. A release film 240 may be utilized as a barrier between the mold cavity and the interior mold surfaces of the top mold half 220. Typical release films comprise fluorocarbon-based polymers and are typically 0.5 to 5 mils thick. Alternatively, a release agent could be applied to the inner surface of the upper mold half 220. Release agents are typically comprised of fluorocarbon polymers held in a liquid suspension that may be wiped onto a mold surface. The fluorocarbon polymers may include reactive molecules that cross-link during a curing operation to create a continuous film on the mold surface.

According to a preferred embodiment of the invention, the bottom surface of the chip 110 butts directly up against the mold surface of the top mold half 220 except for any applicable intervening layer of release film 240. This configuration ensures that the resin will not encapsulate the bottom surface of the chip 110 during molding, permitting Thermal Interface Materials or Integral Heat Spreaders to be attached directly to the chip, thereby maximizing potential heat transfer rates.

Figure 2D:
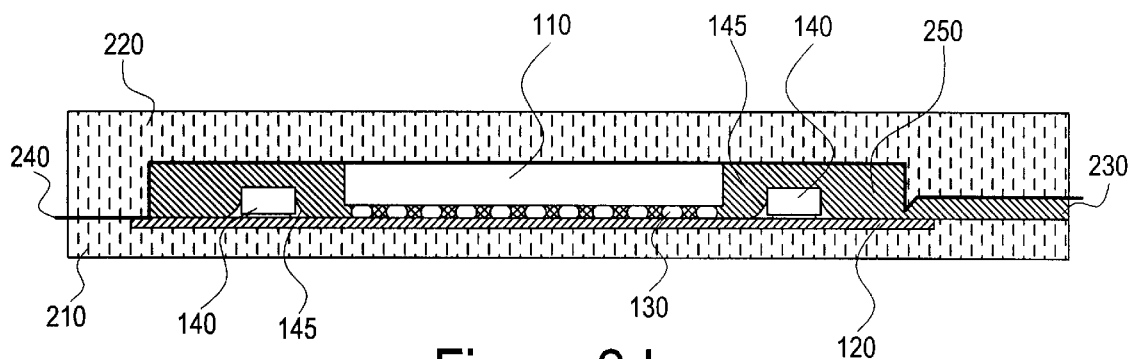

Next, in block 320 as shown in FIG. 2d, a resin is injected into the cavity under pressure through runner 230 to underfill the gap between the top surface of the chip 110 and the corresponding substrate surface, encapsulating the solder bumps 130, as well as to form the structure necessary to stiffen the chip/substrate package. Typically, the mold is designed such that when properly injected, the resin surrounding the chip 110 will have a thickness close to the height of the chip's bottom surface from the substrate surface. Furthermore, the resin will encapsulate much of the substrate's surface. It is this volume of resin once cured that provides for the necessary rigidity of the completed package.

Typically, the resin utilized will be an epoxy having high strength and good thermal properties, including resistance to the high temperatures that can be generated by an integrated chip during operation. Additionally, epoxies in the uncured liquid state have relatively low viscosities making them ideal for injection into close quarters such as the space between the chip and substrate surfaces. Other resins may be utilized as appropriate. Potential alternative resins include BMI's, polyesters, and thermoplastics.

Table 1 lists some of the properties of a desirable epoxy formulation. In general, the difference in the coefficient of thermal expansion (CTE) between virgin unfilled epoxy and either a silicon chip or a reinforced plastic substrate will be significant. Given the wide range of operating temperatures that a flip chip package is likely to experience, it is desirable to tailor the CTE's of the joined materials to be as close as possible, thereby minimizing any induced thermal stresses. Conversely, too much filler could cause the viscosity of the epoxy formulation to increase to a point where it is resistant to flow in the gap between the top of the chip 110 and the corresponding surface of the substrate 120. Additionally, if the filler has a higher modulus than the virgin epoxy, it acts to increase the stiffness of the cured epoxy formulation which results in greater rigidity for the resulting chip package. Accordingly, a filled epoxy resin comprising about 80% by weight silica microspheres is believed to be the ideal formulation.

TABLE 1

| | |
|---|---|
| Filler material | Silica |
| Filler shape | All Spherical |
| Filler content | 80 wt % |
| Mean particle size | 4 um |
| Maximum particle size | 12 um |
| Curing condition | 165 C./120 sec |
| Spiral flow | 180 cm at 165 C./120 sec, 6.9 N/mm2 |
| Gelation time | 30 sec at 165 C. |
| Hot hardness | 85 at 165 C./120 sec |
| Melt viscosity | 10 Pa*s at 165 C. |
| Glass transition temperature | 145 deg C. |
| CTE below Tg | 14 ppm |
| CTE above Tg | 56 ppm |
| Specific gravity | 1.88 at 25 C. |
| Thermal conductivity | 0.63 W/m*C |
| Flexural modulus | 13700 N/mm2 at 25 C. |
| Flexural strength | 120 N/mm2 at 25 C. |
| Volume resistivity | 1.00 E + 14 ohm*m 25 C. |
| Water absorption | 0.5% |

It is also desirable to have an epoxy formulation that cures relatively quickly at an elevated temperature so that chip packages can be fabricated at production rates, but that has a relatively long pot life at room temperature or even slightly elevated temperatures so that the mixed epoxy and catalyst does not cure in the supply lines before being injected into the mold. The preferred resin has a cure profile of approximately 120 seconds at 165 C. Depending on the properties of an alternative resin formulation, different cure profiles may be specified that provide suitable results. It is also contemplated that certain thermoplastic resins may be utilized in the molding operation that do not have a cure temperature but rather melt at an elevated temperature and solidify when cooled.

Figure 2E:
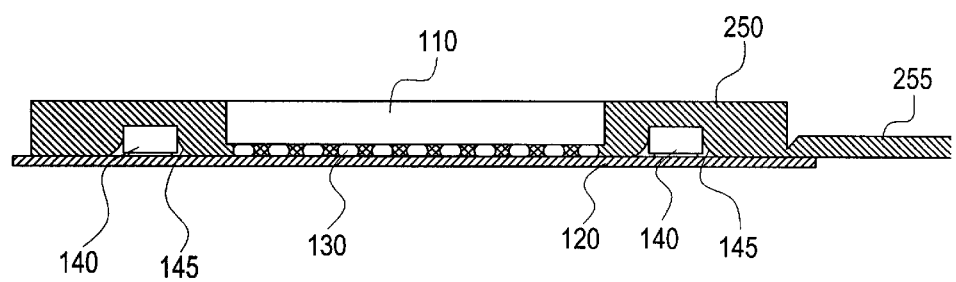
Figure 2F:
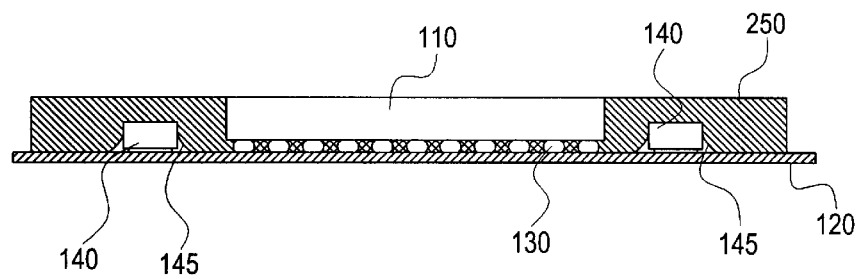

Utilizing an epoxy resin of the type and formulation specified in table 1, the molding process would proceed, according to one embodiment of the invention, as generally described infra. First, the mold is either heated to 165 degrees Celsius with the incomplete chip package contained therein, or the mold is maintained at 165 degrees Celsius and the incomplete package is inserted therein. Next, the epoxy resin is injected through runner 230 into the mold at a pressure of around 1–5 Mpa. The resin may be preheated to an intermediate temperature to lower the viscosity of the resin and facilitate the resin transfer molding process. Once the proper amount of epoxy is injected into the mold cavity, the mold is held at 165 degrees Celsius for at least 120 seconds to fully cure the epoxy. After cure, the mold is separated and the packaged chip, as depicted in FIG. 2e, is removed. Typically, the molded flip chip package will be removed while the mold is hot so that the mold may immediately be re-used to fabricate another package; however it is conceivable that the mold may be permitted to cure before removing the molded flip chip package. Finally, the excess solidified epoxy 255 from within the runner cavity is removed, resulting in a completed flip chip package.

The resin upon curing forms a monolithic structure 250 which is adhesively bonded to the chip and the substrate. This structure 250 fills the gap between the top surface of the chip and the surface of the substrate, effectively encapsulating each of the solder bumps that electrically couple the chip 110 and substrate 120 together. Furthermore, the monolithic structure 250 encapsulates most of the side surfaces of the chip 110 and most of the surface of the substrate, providing the necessary volume to provide sufficient rigidity to the resulting flip chip package.

In the foregoing description, for the purposes of explanation, numerous specific details were set forth in order to provide a thorough understanding of the present invention. The invention is, however, not limited to the described embodiments alone. In this vein, the detailed description provided herein is not intended to limit the scope of the invention as claimed. To the contrary, embodiments of the claims have been contemplated that encompass the fall breadth of the claim language as would be obvious to one of ordinary skill in the art. Accordingly, the present invention may be practiced without some of the specific detail provided supra.

What is claimed is:

1. A method comprising:

placing an incomplete flip chip package into a bottom inner cavity of a bottom mold portion, the incomplete flip chip package comprising a chip and a substrate, the chip having a top surface coupled by reflowed solder bumps to an upper surface of the substrate, the chip further composing a bottom surface opposite the top surface and one or more side surfaces between the top and bottom surfaces;

mating an upper mold portion with the lower mold portion, the upper mold portion having an upper inner cavity, including an upper inner surface which is coated with a release film, and the bottom surface of the chip butts against the upper inner surface, the upper and bottom inner cavities forming a mold inner cavity enclosing the incomplete flip chip package, and forming a runner between the upper and lower mold portions;

injecting a predetermined amount of a liquid resin into the mold inner cavity through the runner, the liquid resin encapsulating substantially all or the one or more side surfaces and substantially all of the upper surface, the liquid resin further filling a gap between the top surface of the chip and an adjacent portion of the upper surface of the substrate, encapsulating the reflowed solder bumps; and curing the liquid resin by maintaining the mold at an elevated temperature for a predetermined period of time, the elevated temperature being equal to or greater than the cure temperature of the filled liquid resin for the predetermined period of time.

2. The method of claim 1, additionally comprising separating the mold between the upper mold portion and the lower mold portion to expose a molded chip package, the upper mold portion being removed with the release film.

* * * * *

UNITED STATES PATENT AND TRADEMARK OFFICE
CERTIFICATE OF CORRECTION

PATENT NO.    : 6,632,704 B2
DATED         : October 14, 2003
INVENTOR(S)   : Kumamoto et al.

It is certified that error appears in the above-identified patent and that said Letters Patent is hereby corrected as shown below:

Column 5,
Line 14, delete "fall", insert -- full -- .

Column 6,
Line 5, after "upper inner surface,", insert -- the lower mold portion having a lower inner surface, and -- .
Lines 8 and 9, delete "between the upper and lower mold portions", insert -- that has an upper portion that includes the release film coated on the upper inner surface of the upper mold portion, and a lower inner surface that includes the lower inner surface of the lower mold -- .

Signed and Sealed this

Twenty-fifth Day of May, 2004

JON W. DUDAS
*Acting Director of the United States Patent and Trademark Office*